United States Patent [19]

Kim

[11] Patent Number: 5,305,259

[45] Date of Patent: Apr. 19, 1994

[54] POWER SOURCE VOLTAGE TRACKING CIRCUIT FOR STABILIZATION OF BIT LINES

[75] Inventor: Byung-Yoon Kim, Seoul, Rep. of Korea

[73] Assignee: SamSung Electronics Co. Ltd., Kungki, Rep. of Korea

[21] Appl. No.: 359,274

[22] Filed: May 31, 1989

[30] Foreign Application Priority Data

May 2, 1989 [KR] Rep. of Korea ............. 1989-5915

[51] Int. Cl.$^5$ .................. G11C 7/00; H03K 3/01; G05F 3/04; G05F 3/08; H02J 1/14
[52] U.S. Cl. .................. 365/189.09; 365/203; 365/204; 365/206; 307/296.1; 307/296.6; 320/1; 323/311; 323/312
[58] Field of Search .......... 365/204, 226, 203, 206, 365/189.09; 307/296.1, 296.6, 296.8, 540, 542; 323/311, 313, 314, 312; 320/1, 5, 9, 10; 315/241 P, 241 S, 209 T, 209 R

[56] References Cited

U.S. PATENT DOCUMENTS

| | | | |
|---|---|---|---|
| 3,909,631 | 9/1975 | Kitagawa | 365/203 |
| 4,355,377 | 10/1982 | Suo et al. | 365/203 |
| 4,453,235 | 6/1984 | Chao | 365/210 X |
| 4,555,655 | 11/1985 | Tanaka | 320/1 |
| 4,649,291 | 3/1987 | Konishi | 307/296.7 |
| 4,694,199 | 9/1987 | Goetz | 323/313 |
| 4,754,167 | 6/1988 | Conkle et al. | 323/313 |
| 4,800,297 | 1/1989 | Novosel et al. | 307/354 X |
| 4,810,962 | 3/1989 | Gaudenzi et al. | 323/314 |
| 4,868,483 | 9/1989 | Tsujimoto | 323/313 |
| 4,893,029 | 1/1990 | Matsuo et al. | 365/226 |
| 4,899,066 | 2/1990 | Aikawa et al. | 365/204 |
| 4,914,634 | 4/1990 | Akrout et al. | 365/233 |

Primary Examiner—Joseph L. Dixon
Assistant Examiner—Michael A. Whitfield
Attorney, Agent, or Firm—Robert E. Bushnell

[57] ABSTRACT

A power source voltage tracking circuit, for providing a given voltage which is lower than power source voltage, containing a first node for applying a power source voltage, a second node and an output line, a load connected between the first node and the output line to precharge the output line with the given voltage, elements connected between said first node and said second node to charge the second node, and elements to discharges the output line charged with the given voltage in response to the charging voltage of the second node.

23 Claims, 3 Drawing Sheets

POWER SOURCE VOLTAGE TRACKING CIRCUIT FOR STABILIZATION OF BIT LINES

BACKGROUND OF THE INVENTION

1. Field of the Invention

The present invention relates to a power source voltage tracking circuit. In particular, it relates to a circuit which supplies stabilized voltage by tracking fluctuations in voltage.

2. Description of the Prior Art

A static random access memory (SRAM) device employs the art of precharging bit lines during readout operation, its bit lines swing within limits of voltage as much as 1 volt lower than the power source voltage by art.

Referring to FIG. 1, a load transistor T8, a diode-connected N channel MOS FET, is connected between a power source voltage Vcc and precharge line 20 to precharge the precharge line 20 with a voltage equal to Vcc−VTH (VTH is a threshold voltage of the load transistor T8).

Each pair of bit lines (BL1, $\overline{BL1}$) (BLn, $\overline{BLn}$) are connected with the precharge line 20 through an equalizing circuit 14 which comprises P-channel MOS FET transistors T1-T3 which are activated by equalizing pulse φB and P channel MOS FET transistors T4, T5 which are in the normally ON state.

Between pairs of bit lines, a plurality of memory cells 10 are arranged in the form of matrices placed in rows and columns, and the memory cells in the same row are activated by row pulse φWL. Each pair of the bit lines are connected to data lines DL, $\overline{DL}$ coupled with a sense amplifier 12 through pass transistors T6, T7 of P channel MOS FET. The pass transistors T6, T7 connected with each pair of the bit lines are activated by column pulses CD1 through CDn provided by a column decoder.

During a readout cycle, the pairs of bit lines (BL1, $\overline{BL1}$) (BLn, $\overline{BLn}$) are precharged and equalized with Vcc−VTH by a transistor T8 and equalizing circuit 14. Thereafter, data stored in memory cells 10 are sent to pairs of bit lines by a row pulse φWL and the sent data is transmitted to a pair of data lines DL, $\overline{DL}$ through a pair of pass transistors activated by a column pulse, and amplified by a sense amplifier 12. The transistors T4, T5 are always turned on so as to prevent the pairs of bit lines from excessive voltage swings during the readout cycle of the memory cells 10. Such a precharging mechanism enables the sense amplifier to operate efficiently in terms of sensing time and amplification.

However, once power source voltage Vcc increases along with its fluctuations, the precharge voltage of the pairs of bit lines increase to the extent that power source voltage increased. Thereafter, if the power source voltage Vcc drops to normal power source voltage or below, the voltage precharged to the pairs of bit lines is maintained. Even if, practically, discharge takes place through memory cells connected between the pairs of bit lines, it takes a relatively long time to discharge to the precharge voltage which tracks fluctuations of the power source voltage. As a result, the voltage of pairs of data lines DL, $\overline{DL}$ during data readout operation is higher than power source voltage Vcc and sensing operation of the sense amplifier 12 is thereby disturbed.

SUMMARY OF THE INVENTION

Accordingly, an object of the present invention is to provide a power source voltage tracking circuit for the solution of the problem described.

Another object of the present invention is to provide a power source voltage tracking circuit which provides a required amount of voltage depending on fluctuations in power source voltage.

In order to attain such objects as described hereinabove, a power source voltage tracking circuit for providing a given voltage which is lower than power source voltage, comprises a first node for applying a power source voltage, a second node and an output line, a load means connected between the first node and the output line to precharge the output line with the given voltage, a device connected between the first and second node to charge the second node, and a device which discharges the output line with the given voltage in response to the charging voltage of the second node.

BRIEF DESCRIPTION OF THE DRAWINGS

For a better understanding of the invention and to show how the same may be carried into effect, reference will now be made, by way of example, to the accompanying diagrammatic drawings, in which.

DESCRIPTION OF THE PREFERRED EMBODIMENTS

Figure 1:
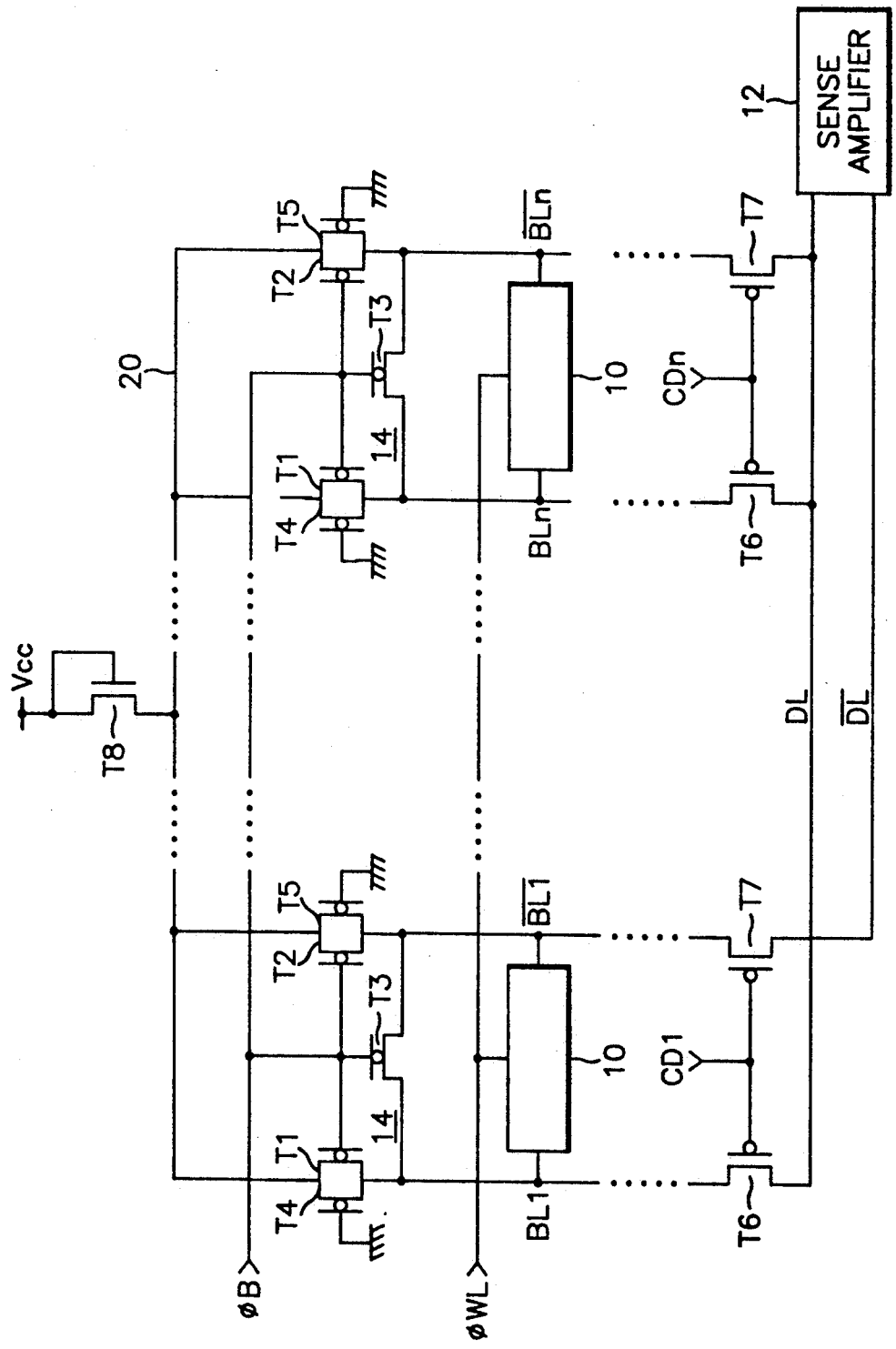
FIG. 1 is a circuit diagram of a conventional static random access memory cell array.
Figure 2:
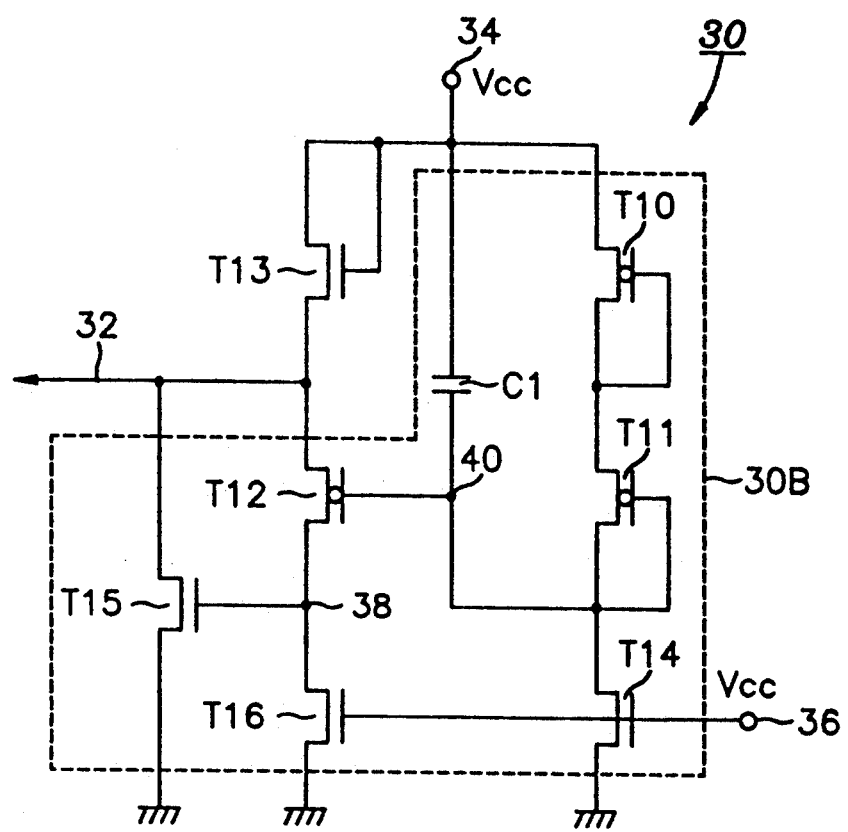
FIG. 2 is a circuit diagram of the present power source voltage tracking circuit.
Figure 3:
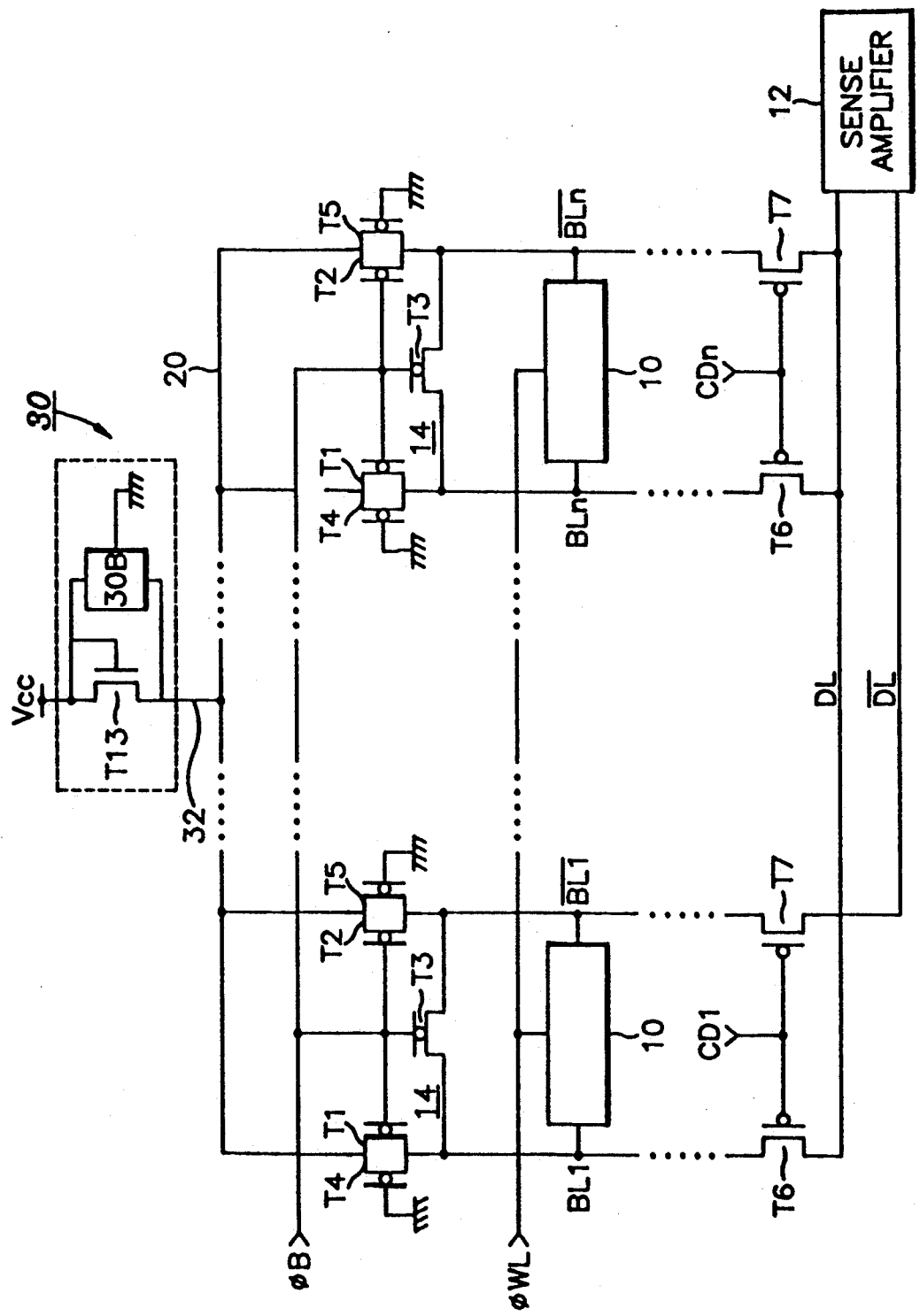
FIG. 3 is a circuit diagram of a static random access memory cell array implementing the power source voltage tracking circuit of the invention.

Referring to FIG. 2, it must be noted that the output line 32 is connected with the precharge line 20 in FIG. 1 and a N channel MOS FET transistor, the T13 is a load transistor same as the transistor T8 in FIG. 1. As to normal power source voltage, it is normal standard voltage used in a usual memory device. For instance, voltage indicating 5 V will be used. Transistors T13 through T16 are N channel MOS FET transistors and the substrates of these transistors are grounded. Transistors T10 through T12 are P channel MOS FET transistors and the substrates of these transistors are connected with power source voltage Vcc. A drain-source channel of transistor T15 is connected between the output line 32 and ground, and transistors T12, and T16, with their drain-source channel connected in series through a connection node 38, are connected in parallel with the transistor T15 between the output line 32 and ground. The connection node 38 is connected to a gate of the transistor T15. Between the first node which supplies power source voltage, and the second node is a parallel connection between a capacitor C1 and diode-connected transistors T10, T11 connected in series with each other. Between the second node and ground the drain-source channel of a transistor T14 is connected. A gate of the transistor T12 is connected with the second node 40 and gates of the transistors T14, T16 are connected with power source voltage Vcc through a third node 36. The capacitor C1 is provided to temporarily vary the power source voltage with the second node immediately, and the transistors T10, T11 are provided to charge the second node 40 with a given voltage, namely, with the value obtained by deducting the sum of a threshold voltage of the transistors T10, T11 from power source voltage Vcc, after the lapse of required time from the momentary transition of power source voltage Vcc. The part comprising transistors T12, T15, T16 is provided to discharge the voltage charged to the output line 32 according to the voltage given to the second node 40. The transistor T16 is provided to discharge the charged voltage of connection node 38 and the transistor T14 is provided to pass the noise which is furnished to the second node 40. As to the channel width against the length of transistors T16, T14, it is designed by value to be so small as not to discharge the charged voltage of the nodes 38, 40 promptly.

The size of the transistor T14 can be much smaller than that of the transistor T16 and, if necessary, it may not be used. On the other hand, the load transistor T13 has size large enough to provide current which charges pairs of bit lines, and transistor T15 is designed large enough to discharge the voltage on the output line 32 with the desired value within a fixed time when it is turned on but is made smaller than the size of transistor T13 to control excessive discharge.

Now, the operation of the power source voltage tracking circuit under the present invention will be described. A threshold voltage of each transistor which will be specified hereinafter, will be an absolute value. In the normal power source voltage NVcc, the output line 32 is charged by the voltage of NVcc−VTH13. Here, VTH13 is a threshold voltage of the transistor T13. The voltage of the second node 40 is charged by the voltage of (NVcc−VTH10−VTH11) through transistors T10, T11. Here, VTH10 and VTH11 are the absolute values of the threshold voltage of transistors T10, T11. Because the voltage between gate and source of transistor T12 is lower than its threshold voltage due to the voltage charged to the second node 40, the transistor T12 is turned off and the transistor T15 is also turned off.

Thereafter, when the power source voltage Vcc suddenly increases to a level of ΔVH above the normal power source voltage NVcc, the increased voltage appears at the second node 40 immediately through capacitor C1, but transistor T12 continues to be turned off. Transistor T15 is also turned off. Thereafter, the output line 32 is charged by (NVcc−VTH13+ΔVH) and the node 40 is charged by (NVcc−VTH10−VTH11+ΔVH) through transistors T10, T11. Therefore, transistors T12, T15 continue to be turned off.

When the increased voltage (NVcc+ΔVH) suddenly decreases to the level of ΔVL at a certain time, the decreased voltage is immediately delivered to the second node 40. If ΔVL has sufficient value which enables the gate-to-source voltage to be greater than the threshold voltage of the transistor T12, the transistor T12 will be turned on and, by the voltage which is charged to the connection node 38 through the transistor T12, the transistor T15 will be turned on. Thereafter, the output line 32 is discharged at (NVcc−VTH13+ΔVH−ΔVL) by turning on transistor T15 and the second node 40 is stabilized at (NVcc−VTH10−VTH11+ΔVH−ΔVL) through the transistors T10, T11. At this time, transistor T12 is turned off and transistor T15 is also turned off. Therefore, the output line 32 can be charged at any time with the voltage which is lower, by an amount equal to the threshold voltage of load transistor T13, than power source voltage according to fluctuations in the power source voltage.

It is readily understandable to those skilled in this field that such a result can be obtained, even for small fluctuations in power source voltage, by minimizing the difference between gate-to-source voltage and threshold voltage of the transistor T12.

As described hereinabove, when the present power source voltage tracking circuit is employed to SRAM, the sense amplifier can fulfill its operation of correctly sensing the data, regardless of fluctuations in power source voltage.

While the invention has been particularly shown and described with reference to a preferred embodiment, it will be understood by those skilled in the art that modifications in detail may be made without departing from the spirit and scope of the invention.

What is claimed is:

1. A power source voltage tracking circuit, comprising:
   a first node for receiving a power source voltage;
   a second node;
   an output line;
   load means coupled between said first node and output line to charge said output line with a first voltage lower in value than the power source voltage, said load means is a diode-connected MOS FET transistor coupled between said first node and output line;
   means coupled between said first and second nodes for charging said second node with a second voltage, said charging means is coupled in the form of a parallel connection between a plurality of series coupled diode-connected MOS FET transistors and a capacitor; and
   means for discharging said output line in response to said second voltage on said second node.

2. A circuit according to claim 1, wherein said discharging means comprises:
   a first MOS FET transistor having a source-drain channel connected between said output line and a connection node, and a gate connected to said second node;
   a second MOS FET transistor having a drain-source channel connected between said connection node and a reference potential, and a gate connected to the power source voltage; and
   a third MOS FET transistor having a drain-source channel connected between said output line and the reference potential, and a gate connected to said connection node.

3. A circuit according to claim 2, further comprising a fourth MOS FET having a drain-source channel connected between said second node and the reference potential, and a gate connected to the power source voltage.

4. A circuit according to claim 2, further comprising means for passing noise coupled between said second node, the reference potential and the power source voltage for passing the noise furnished to said second node.

5. A circuit according to claim 1, further comprising means for passing noise coupled between said second node, the reference potential and the power source voltage for passing the noise furnished to said second node.

6. A power source voltage tracking circuit, comprising:

a first node for receiving a power source voltage;
a second node;
an output line;
load means coupled between said first node and output line to charge said output line with a first voltage lower in value than the power source voltage;
means coupled between said first and second nodes for charging said second node with a second voltage; and
means for discharging said output line in response to said second voltage on said second node, wherein said discharging means comprises:
  a first MOS FET transistor having a source-drain channel connected between said output line and a connection node, and a gate connected to said second node;
  a second MOS FET transistor having a drain-source channel connected between said connection node and a reference potential, and a gate connected to the power source voltage; and
  a third MOS FET transistor having a drain-source channel connected between said output line and the reference potential, and a gate connected to said connection node.

7. A power source voltage tracking circuit, comprising:
a first node for receiving a power source voltage;
a second node;
an output line;
load means coupled between said first node and output line to charge said output line with a first voltage lower in value than the power source voltage;
means coupled between said first and second nodes for charging said second node with a second voltage, wherein said charging means is coupled in the form of a parallel connection between a plurality of series coupled diode-connected MOS FET transistors and a capacitor; and
means for discharging said output line in response to said second voltage on said second node.

8. A power source voltage tracking circuit, comprising:
a first node for receiving a power source voltage;
a second node;
an output line;
load means coupled between said first node and output line to charge said output line with a first voltage lower in value than the power source voltage;
means coupled between said first and second nodes for charging said second node with a second voltage;
means for discharging said output line in response to said second voltage on said second node; and
a MOS FET having a drain-source channel connected between said second node and the reference potential, and a gate connected to the power source voltage.

9. A power source voltage tracking circuit, comprising:
an output line;
load means coupled between a power source exhibiting an amplitude and said output line for charging said output line;
means, for charging a second node, coupled between the power source and said second node, wherein said charging means is coupled in the form of a parallel connection between a plurality of series coupled diode-connected MOS FET transistors and a capacitor; and
means exhibiting a threshold voltage, coupled between said output line, second node, power source and a reference potential for discharging said output line of its charged voltage when said amplitude of said power source drops below said threshold value.

10. A circuit according to claim 9, wherein said load means is a diode-connected MOS FET transistor coupled between said power source and output line.

11. A circuit according to claim 10, wherein said charging means is coupled in the form of a parallel connection between a plurality of series coupled diode-connected MOS FET transistors and a capacitor.

12. A circuit according to claim 11, wherein said discharging means comprises:
  a first MOS FET transistor having a source-drain channel connected between said output line and a connection node, and a gate connected to said second node;
  a second MOS FET transistor having a drain-source channel connected between said connection node and a reference potential, and a gate connected to the power source voltage; and
  a third MOS FET transistor having a drain-source channel connected between said output line and the reference potential, and a gate connected to said connection node.

13. A circuit according to claim 12, further comprising a fourth MOS FET having a drain-source channel connected between said second node and the reference potential, and a gate connected to the power source voltage.

14. A circuit according to claim 13, further comprising means for passing noise coupled between said second node, the reference potential and the power source voltage for passing the noise furnished to said second node.

15. A circuit according to claim 9, wherein said discharging means comprises:
  a first MOS FET transistor having a source-drain channel connected between said output line and a connection node, and a gate connected to said second node;
  a second MOS FET transistor having a drain-source channel connected between said connection node and a reference potential, and a gate connected to the power source voltage; and
  a third MOS FET transistor having a drain-source channel connected between said output line and the reference potential, and a gate connected to said connection node.

16. A circuit according to claim 9, further comprising a MOS FET having a drain-source channel connected between said second node and the reference potential, and a gate connected to the power source voltage.

17. A circuit according to claim 9, further comprising means for passing noise coupled between said second node, the reference potential and the power source voltage for passing the noise furnished to said second node.

18. A random access memory device, comprising:
a plurality of bit line pairs coupled with a plurality of memory cells;
means for equalizing said bit line pairs connected between each pair of bit lines and a precharge line;

load means coupled between a power source voltage and said precharge line for precharging said precharge line and said bit line pairs with a first voltage lower by a given voltage than the power source voltage; and means connected to an input terminal of said load means and an output terminal of said load means, for providing said precharge line and said bit line pairs with the first voltage, wherein said providing means further comprises:

means coupled between said precharge line, a reference potential, a second node and the power source voltage, for discharging an output line;

means coupled between the power source voltage and said second node, for charging said second node; and means coupled between said second node, the reference potential and the power source voltage, for passing noise furnished to said second node, wherein said charging means is coupled in the form of a parallel connection between a plurality of series coupled diode-connected MOS FET transistors and a capacitor.

19. A device according to claim 18, wherein said load means is a diode-connected MOS FET transistor and said given voltage is a threshold voltage of said diode-connected MOS FET transistor.

20. A device as claimed in claim 18, wherein said discharging means comprises:

a first MOS FET transistor having a source-drain channel connected between said output line and a connection node, and a gate connected to said second node;

a second MOS FET transistor having a drain-source channel connected between said connection node and a reference potential, and a gate connected to the power source voltage; and a third MOS FET transistor having a drain-source channel connected between said output line and the reference potential, and a gate connected to said connection node.

21. A device as claimed in claim 18, said noise passing means comprises a MOS FET having a drain-source channel connected between said second node and the reference potential, and a gate connected to the power source voltage.

22. A random access memory device, comprising:

a plurality of bit line pairs coupled with a plurality of memory cells;

means for equalizing said bit line pairs connected between each pair of bit lines and a precharge line;

load means coupled between a power source voltage and said precharge line for precharging said precharge line and said bit line pairs with a first voltage lower by a given voltage than the power source voltage; and means connected to an input terminal of said load means and an output terminal of said load means, for providing said precharge line and said bit line pairs with the first voltage, wherein said providing means further comprises:

means coupled between said precharge line, a reference potential, a second node and the power source voltage, for discharging an output line, wherein said discharging means comprises:

a first MOS FET transistor having a source-drain channel connected between said output line and a connection node, and a gate connected to said second node;

a second MOS FET transistor having a drain-source channel connected between said connection node and a reference potential, and a gate connected to the power source voltage; and a third MOS FET transistor having a drain-source channel connected between said output line and the reference potential, and a gate connected to said connection node;

means coupled between the power source voltage and said second node, for charging said second node; and means coupled between said second node, the reference potential and the power source voltage, for passing noise furnished to said second node.

23. A device as claimed in claim 22, said noise passing means comprises a fourth MOS FET having a drain-source channel connected between said second node and the reference potential, and a gate connected to the power source voltage.

* * * * *